United States Patent
Song (10) Patent No.: US 9,101,047 B2
(45) Date of Patent: Aug. 4, 2015

(54) TERMINAL INCLUDING TOUCH UNIT AND METHOD FOR MANUFACTURING TOUCH UNIT

(71) Applicant: Pantech Co., Ltd., Seoul (KR)

(72) Inventor: Chang Jin Song, Seoul (KR)

(73) Assignee: Pantech Co., Ltd., Seoul (KR)

( * ) Notice: Subject to any disclaimer, the term of this patent is extended or adjusted under 35 U.S.C. 154(b) by 153 days.

(21) Appl. No.: 14/015,208

(22) Filed: Aug. 30, 2013

(65) Prior Publication Data

US 2014/0063755 A1    Mar. 6, 2014

(30) Foreign Application Priority Data

Aug. 31, 2012    (KR) ........................ 10-2012-0096751

(51) Int. Cl.
| | |
|---|---|
| H05K 1/00 | (2006.01) |
| H05K 7/02 | (2006.01) |
| H05K 3/00 | (2006.01) |
| H05K 1/02 | (2006.01) |

(52) U.S. Cl.
CPC ................ *H05K 7/02* (2013.01); *H05K 1/0287* (2013.01); *H05K 3/00* (2013.01); *H05K 2201/0326* (2013.01); *H05K 2201/09681* (2013.01)

(58) Field of Classification Search
USPC ................................... 361/748, 760, 761, 736
See application file for complete search history.

(56) References Cited

U.S. PATENT DOCUMENTS

2013/0047420 A1*   2/2013   Ra et al. .......................... 29/622
2013/0155630 A1*   6/2013   Yilmaz et al. ................. 361/748

FOREIGN PATENT DOCUMENTS

| KR | 10-2010-0021112 | 2/2010 |
|---|---|---|
| KR | 10-2012-0056033 | 6/2012 |

* cited by examiner

*Primary Examiner* — Andargie M Aychillhum
(74) *Attorney, Agent, or Firm* — H.C. Park & Associates, PLC (57) ABSTRACT

A terminal includes: a touch unit that includes first electrodes connected in a first diagonal direction, the first diagonal direction being oblique to each side of the touch unit, and a second electrodes disposed in the second diagonal direction which intersects the first diagonal direction, the second diagonal direction being oblique to each side of the touch unit, and a Printed Circuit Board (PCB) configured to receive information generated in response to electric signals from one or more of the first electrodes and the second electrodes. Accordingly, a width of the terminal may be reduced as signal wirings need not be formed at the side surface thereof.

17 Claims, 8 Drawing Sheets

TERMINAL INCLUDING TOUCH UNIT AND METHOD FOR MANUFACTURING TOUCH UNIT

CROSS-REFERENCE TO RELATED APPLICATION

This application claims priority to and the benefit under 35 U.S.C. §119(a) of Korean Patent Application No. 10-2012-0096751, filed on Aug. 31, 2012, the contents of which in its entirety are herein incorporated by reference.

BACKGROUND

1. Field

The present disclosure relates to a touch unit, a terminal including the terminal and a method for manufacturing the same, which may reduce a bezel width by omitting a side wiring.

2. Discussion of the Background

Terminals, such as, smart phones use a touch-screen panel. The touch-screen panel has a transparent display unit. If a desired point on the display unit is touched, the touched location is recognized to perform a corresponding function, or the touched location is used to display information.

The touch-screen panel is classified into an ultrasonic type, an IR type, a resistance type, and a capacitance type. Recently most terminals are implemented in the capacitance type due to the size and appearance.

The capacitance-type touch-screen panel includes a plastic or glass substrate as a base on which a transparent Indium Tin Oxide (ITO) is deposited and an ITO pattern is formed by etching.

Generally, the ITO pattern has a 2-layer structure, where one layer calculates a coordinate in the X direction and the other layer recognizes a coordinate in the Y direction. Various structures such as a diamond pattern and a stripe pattern are developed according to the shape of the ITO pattern. The demand for a slim design is leading to a demand for a single pattern capable of recognizing X and Y coordinates.

To accurately recognize an X coordinate and a Y coordinate of a touch, wirings connected to the ITO pattern are formed on not only upper or lower surfaces of a touch-screen panel, but also side surfaces thereof. As wiring is required at the side surface connected to the ITO pattern in order to recognize a location of a touch, a side bezel width of the terminal increases. The side bezel width may be a width from an end of a display unit displaying an image at a terminal to a side edge of a terminal housing enclosing at least the display unit.

In addition, as the size of a display unit recently increases, the size of a terminal also increases, thereby disturbing easy conveyance of the terminal. Therefore, there is a limit due to the wirings of the touch-screen panel when a terminal manufacturer is trying to decrease the width of a terminal in comparison to a display unit.

SUMMARY

The present disclosure is directed to providing a touch unit capable of reducing a side bezel width of a terminal.

The present disclosure is also directed to providing a terminal including the touch unit capable of reducing a side bezel width.

The present disclosure is also directed to providing a method for manufacturing touch unit capable of reducing a side bezel width.

The touch unit for reducing a width, the terminal including the same and the method for manufacturing the touch unit according to the present disclosure include an electrode pattern structure in which signal wirings present in a conventional touch unit structure are omitted. Therefore, it is possible to reduce a side bezel width of the touch unit and the terminal, and expand a display area. As such, a user may use the terminal usefully and conveniently.

According to exemplary embodiments, there is provided a terminal including a touch unit including: first electrodes disposed in a first diagonal direction, the first diagonal direction being oblique to each side of the touch unit; and second electrodes disposed in a second diagonal direction that intersects the first diagonal direction, the second diagonal direction being oblique to each side of the touch unit, and a Printed Circuit Board (PCB) configured to receive information generated in response to electric signals from one or more of the first electrodes and the second electrodes.

According to exemplary embodiments, there is provided a method of manufacturing a touch unit, the method including: etching first electrodes disposed in a first diagonal direction, the first diagonal direction being oblique to each side of the touch unit; etching second electrodes disposed in a second diagonal direction that intersects the first diagonal direction, the second diagonal direction being oblique to each side of the touch unit.

Additional features of the invention will be set forth in the description that follows, and in part will be apparent from the description, or may be learned by practice of the invention.

It is to be understood that both the foregoing general description and the following detailed description are exemplary and explanatory and are intended to provide further explanation of the invention as claimed. Other features and aspects will be apparent from the following detailed description, the drawings, and the claims.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the principles of the invention.

DETAILED DESCRIPTION

The following description is provided to assist the reader in gaining a comprehensive understanding of the methods, apparatuses, and/or systems described herein. Accordingly, various changes, modifications, and equivalents of the methods, apparatuses, and/or systems described herein will suggest themselves to those of ordinary skill in the art. In addition, descriptions of well-known functions and constructions may be omitted for increased clarity and conciseness.

The invention is described more fully hereinafter with reference to the accompanying drawings, in which exemplary embodiments of the invention are shown. This invention may, however, be embodied in many different forms and should not be construed as limited to the embodiments set forth herein. Rather, these exemplary embodiments are provided so that this disclosure is thorough, and will fully convey the scope of the invention to those skilled in the art. It will be understood that for the purposes of this disclosure, "at least one of X, Y, and Z" can be construed as X only, Y only, Z only, or any combination of two or more items X, Y, and Z (e.g., XYZ, XZ, XYY, YZ, ZZ). Throughout the drawings and the detailed description, unless otherwise described, the same drawing reference numerals are understood to refer to the same elements, features, and structures. The relative size and depiction of these elements may be exaggerated for clarity.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. Furthermore, the use of the terms a, an, etc. does not denote a limitation of quantity, but rather denotes the presence of at least one of the referenced item. The use of the terms "first," "second," and the like does not imply any particular order, but they are included to identify individual elements. Moreover, the use of the terms first, second, etc. does not denote any order or importance, but rather the terms first, second, etc. are used to distinguish one element from another. It will be further understood that the terms "comprises" and/or "comprising", or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof. Although some features may be described with respect to individual exemplary embodiments, aspects need not be limited thereto such that features from one or more exemplary embodiments may be combinable with other features from one or more exemplary embodiments.

In addition, embodiments described in the specification are wholly hardware, and may be partially software or wholly software. In the specification, "unit", "module", "device", "system", or the like represents a computer related entity such as hardware, combination of hardware and software, or software. For example, in the specification, the unit, the module, the device, the system, or the like may be an executed process, a processor, an object, an executable file, a thread of execution, a program, and/or a computer, but are not limited thereto. For example, both of an application which is being executed in the computer and a computer may correspond to the unit, the module, the device, the system, or the like in the specification.

Hereinafter, exemplary embodiments of a touch unit, a terminal including the same and a method for manufacturing the touch unit will be described in detail with reference to the drawings.

Figure 1:
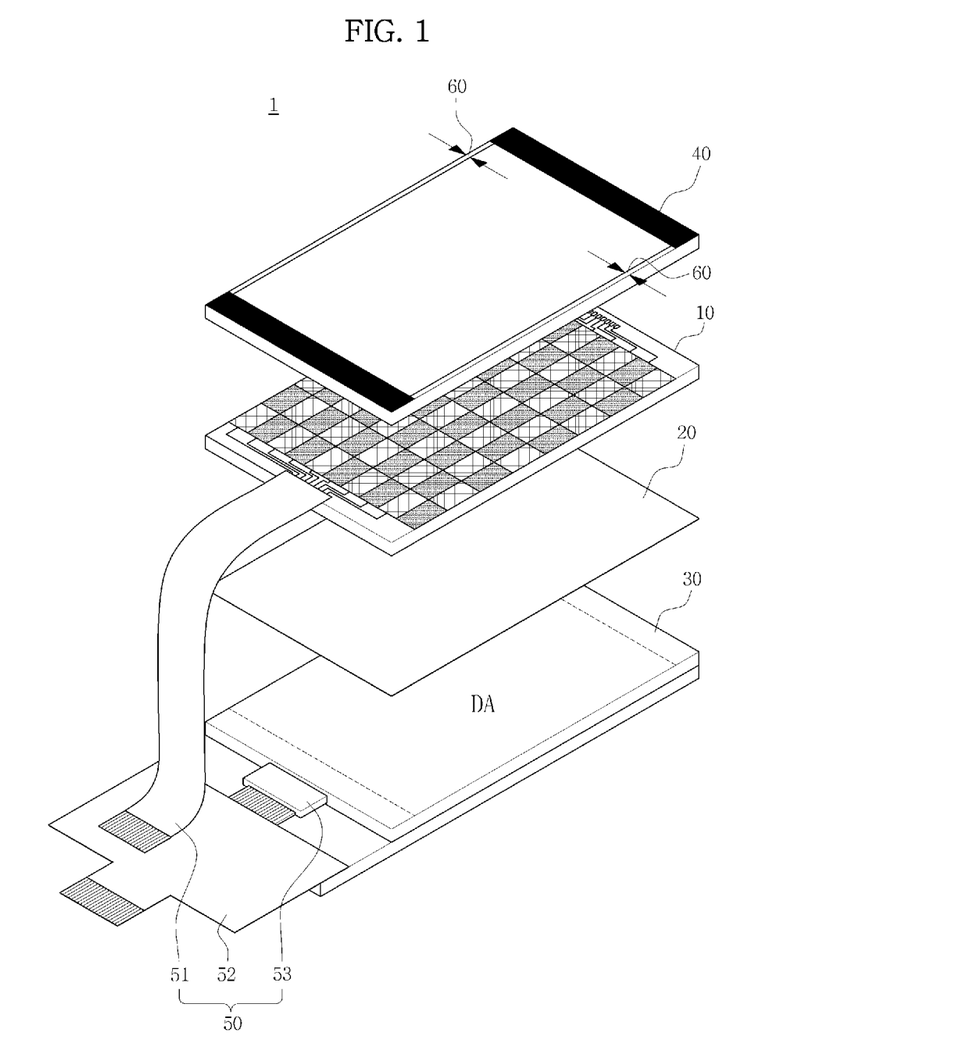
FIG. 1 is a perspective view illustrating a terminal including a touch unit according to exemplary embodiments of the present disclosure.

FIG. 1 illustrates a perspective view of a terminal including a touch unit according to exemplary embodiments of the present disclosure.

A terminal 1 includes a display panel 30 for displaying an image, a touch unit 10 formed or disposed on the display panel 30, and a data processing unit 50 for calculating a location of the sensed touch so that the display panel 30 displays an image according to the touch.

The terminal 1 may include a polarizing plate 20 and a window glass 40 disposed over a front surface of the terminal 1. The polarizing plate 20 is disposed at an upper or lower portion of the touch unit 10 in order to adjust optical characteristics of the light emitted from the display panel 30. The number of polarizing plate 20 may be one or more. The window glass 40 can be made of acrylic material or reinforced glass, and protects a module against external impacts or scratching caused by repeated touches.

The terminal 1 is a touch-screen type display device and may include all kinds of mobile devices, such as, smart phones, tablet computers, net books, PDA, PMP, PSP, MP3 players, e-book readers, navigations, smart cameras, electronic dictionaries, electronic clocks and the like. The terminal may include electronic devices, such as, desktops, smart televisions (TVs), wire/wireless telephones, smart door locks, automatic teller machines (ATMs), ticket dispensers, and the like.

The display panel 30 displays an image according to the touch sensed by the touch unit 10 and performs a corresponding operation. The display panel 30 may be formed by uniting two sheets of upper and lower glass substrates. The display panel 30 may be a flat-plate display device, such as, a Liquid Crystal Display (LCD) panel and a Plasma Display Panel (PDP). Hereinafter, an area of the display panel 30 where an image is actually displayed will be described as a Display Area (DA). For example, the DA can include the area bound by the dashed lines in FIG. 1.

The touch unit 10 is formed or disposed at a portion, for example, a front-facing upper portion, of the display panel 30 and transmits light emitted from the display panel 30. The touch unit 10 may be formed or disposed on a substrate separate from the display panel 30 or may be formed or disposed on an upper substrate of the display panel 30.

If a finger or a touch pen of a user touches the display panel 30, capacitance is changed, and the touch unit 10 changes capacitance and calculates a location of the touch, which is called a capacitance type. In order to sense the touch, the touch unit 10 forms a sensing layer by patterning a transparent electrode, such as, indium tin oxide (ITO) on a glass substrate or a polyethylene terephthalate (PET) film.

The data processing unit 50 receives sensing signals generated according to the change of capacitance of the touch unit 10. The data processing unit 50 calculates a coordinate value of the input touch based on the received sensing signals. The data processing unit 50 may control hardware of the terminal 1 or perform a specific operation of an executing application according to the calculated location of the input touch.

The data processing unit 50 may include connection units 51, 52 and a driving IC 53. When the touch unit 10 is formed or disposed on a substrate separate from the display panel 30, the connection units 51, 52 may be a Printed Circuit Board (PCB), for example, a Flexible Printed Circuit Board (FPCB), and when the touch unit 10 is formed or disposed on the same substrate as the display panel 30, the connection units 51, 52 may be a connection pattern formed or disposed at the substrate. The driving IC 53 may be attached on the FPCB or the display panel 30 in the Chip On Glass (COG) form.

The touch unit 10 may be electrically connected to the driving IC 53 through the connection unit 51. In some embodiments, a driving IC for controlling the touch unit 10 and a driving IC for controlling the display panel 30 may be formed separately. An exemplary bezel width 60 is illustrated in FIG. 1. In some embodiments, the bezel width is minimized. In some embodiments, the bezel width is eliminated.

Figure 2:
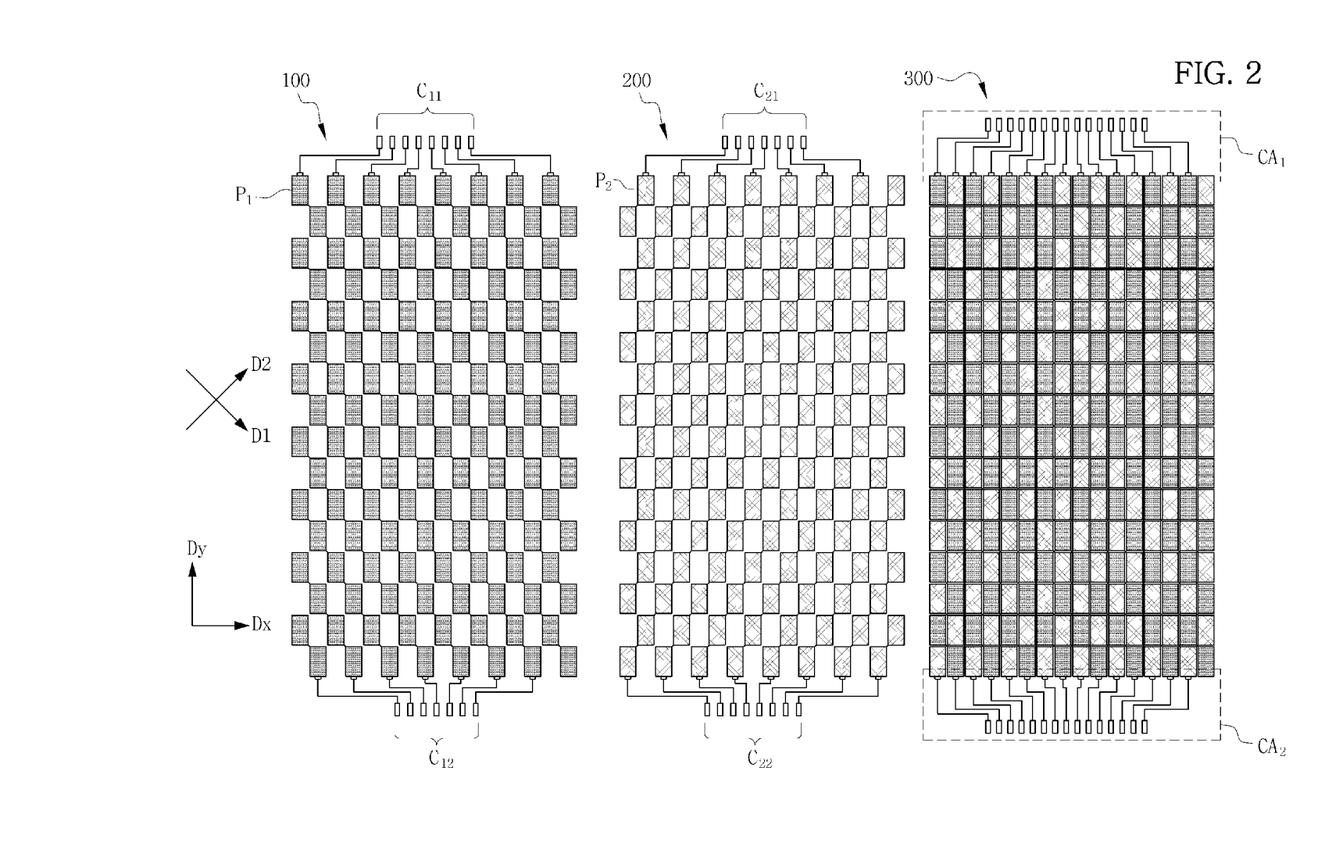
FIG. 2 is a planar view of the touch unit of FIG. 1.
Figure 3:
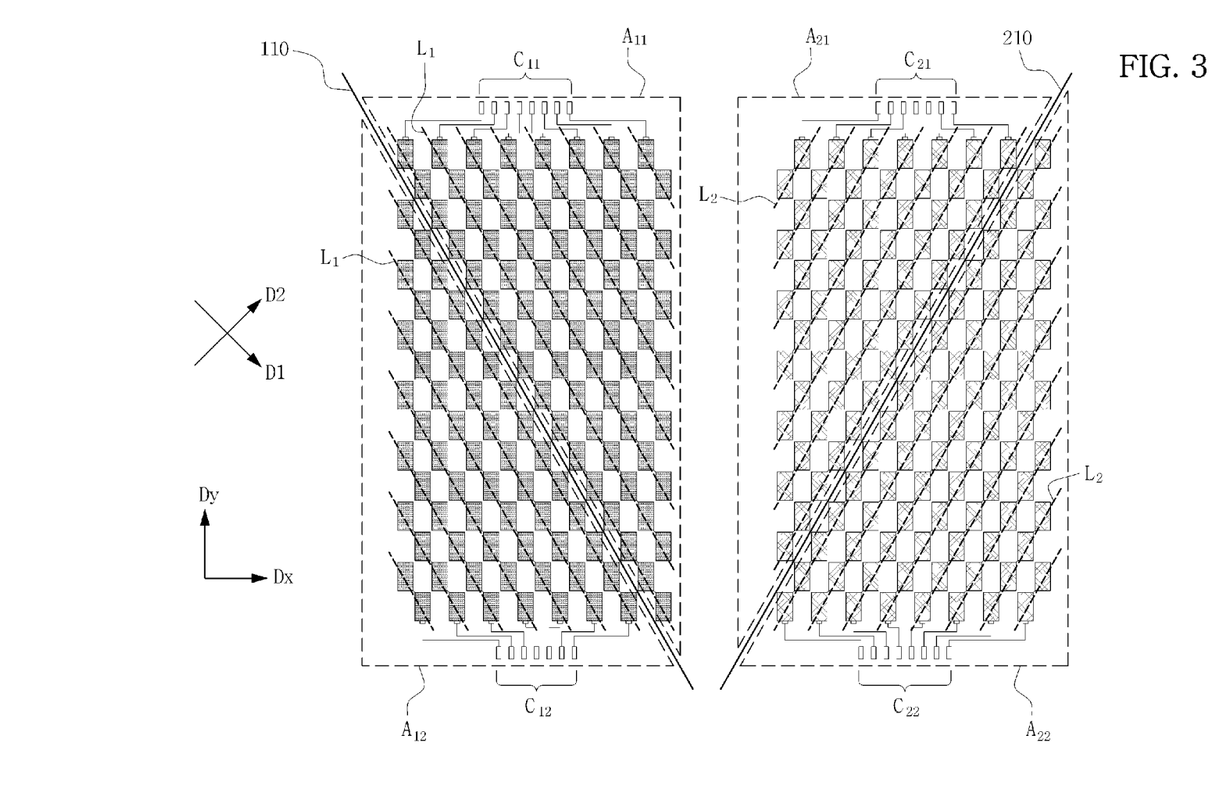
FIG. 3 is a planar view illustrating electrode patterns and connections of the touch unit of FIG. 2.

FIG. 2 is a planar view of the touch unit of FIG. 1. FIG. 3 is a planar view illustrating electrode patterns and connections of the touch unit of FIG. 2. As illustrated in FIG. 2 and FIG. 3, the touch unit 10 according to the present disclosure is configured to be capable of sensing a 2-dimensional coordinate without using a signal wiring unit formed or disposed at a side surface of a conventional touch unit. Accordingly, the side surface does not need a dead zone, and so the side widths of the touch unit 10 and the terminal 1 may be reduced or the touch unit 10 and the display unit 30 may be extended toward the sides without signal wiring units.

FIG. 2 illustrates the touch unit 10 including a first sensing layer 100, a second sensing layer 200 and a configuration 300. In the configuration 300, the first sensing layer 100 overlaps the second sensing layer 200. FIG. 3 illustrates electrode patterns of the first sensing layer 100 and the second sensing layer 200. In some embodiments, the electrode patterns of the first sensing layer 100 and the second sensing layer 200 can be formed or disposed as grids.

The first sensing layer 100 is made by uniformly depositing a transparent electrode material, for example, ITO, on a transparent film or a glass sheet. After that, the transparent electrode material located in a gap between electrodes is etched off to form a plurality of electrodes; the gap between the electrodes forms an insulator between the electrodes. Subsequently, a signal wiring for transferring a capacitance value of the sensing layer to the data processing unit 50 is connected to an end of the sensing layer. The signal wiring is made of common electric conductive metal, such as, silver and copper.

Figure 8:
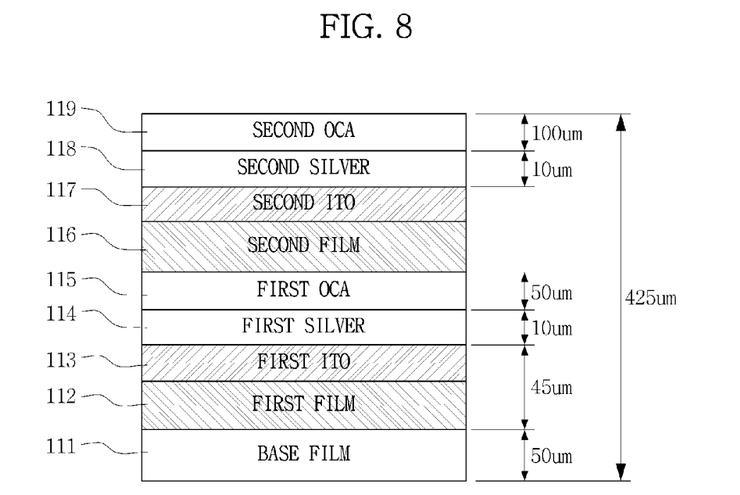
FIG. 8 is a cross-sectional view illustrating the touch unit of FIG. 2.

The second sensing layer 200 may be made in the same or a similar way as the first sensing layer 100. The first sensing layer 100 and the second sensing layer 200 layers may be attached. FIG. 8 is a cross-sectional view illustrating the touch unit of FIG. 2 in which two layers are attached as described above.

Figure 9:
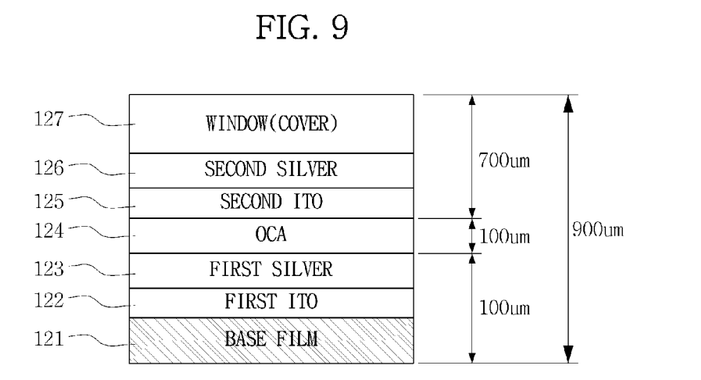
FIG. 9 is a cross-sectional view illustrating a touch unit according to exemplary embodiments of the present disclosure.

In some embodiments, the touch unit 10 may be configured with a single layer to provide a reduced thickness. An electrode pattern and a signal wiring may be formed or disposed on a first surface of a transparent film or glass sheet to provide the first sensing layer 100, form the second sensing layer 200 on a second opposing surface of the transparent film or glass sheet, and then integrating them as a single sheet. In some embodiments, the first sensing layer 100 and the second sensing layer 200 may be formed or disposed on a single sheet. In some embodiments, it is possible to form the first sensing layer 100 on a single transparent film or glass sheet, make insulation on the first sensing layer 100, and form the second sensing layer 200 on the insulation on the first sensing layer 100. FIG. 9 is a cross-sectional view illustrating a touch unit according to exemplary embodiments of the present disclosure. FIG. 9 illustrates a cross section of a touch unit including a single film layer as described above.

The first sensing layer 100 and the second sensing layer 200 are formed or disposed in an area of the touch unit 10 corresponding to the display area DA (see FIG. 1) of the display panel 30, and respectively include a plurality of first electrodes $P_1$ and a plurality of second electrodes $P_2$, as illustrated in FIG. 2.

The first sensing layer 100 and the second sensing layer 200 may have a square or rectangular shape of the same size, extending in the first direction and in the second direction orthogonal to the first direction. In the present disclosure, the first sensing layer 100 and the second sensing layer 200 are described as having a rectangular shape; however, aspects need not be limited thereto such that the first sensing layer 100 and the second sensing layer 200 may have other shapes, for example, circular, triangular, elliptical, or other shape. The first sensing layer 100 and the second sensing layer 200 may be large enough to cover the display area DA of FIG. 1.

As seen in FIG. 3, an imaginary line connecting a single vertex of the first sensing layer 100 to a vertex facing the same is defined as a first diagonal 110. The exemplary first diagonal 110 can parallel a first electrode line $L_1$ (described later). An imaginary line connecting a vertex of the second sensing layer 200 to a vertex facing the same and intersecting the first diagonal 110 is defined as a second diagonal 210. The exemplary second diagonal 210 can parallel a second electrode line $L_2$ (described later). A direction parallel to the first diagonal 110 can be defined as the first diagonal direction D1, and a direction parallel to the second diagonal 210 can be defined as the second diagonal direction D2.

For example, if the first diagonal 110 extends from the upper left end of the first sensing layer 100 to the lower right end thereof, and the second diagonal 210 can extend from the upper right end of the second sensing layer 200 to the lower left end thereof. In some embodiments, the first diagonal 220 can extend from the upper right end of the first sensing layer 100 to the lower left end thereof, and the second diagonal 210 can extend from the upper left end of the second sensing layer 200 to the lower right end thereof. In some embodiments, the first diagonal 110 and the second diagonal 210 can be mirrors when the first sensing layer 100 is placed adjacent to the second sensing layer 200.

As illustrated in FIG. 2 and FIG. 3, the first sensing layer 100 can be shaped as first electrodes $P_1$. The second sensing layer 200 can be shaped as second electrodes $P_2$. In some embodiments, the electrodes $P_1$ and $P_2$ can be of identical shape. In some embodiments, the patterns for etching the electrodes $P_1$ and $P_2$ can provide an identical number and size of electrodes in the first sensing layer 100 and the second sensing layer 200. In some embodiments, the electrodes $P_1$ and $P_2$ can be disposed in a same layer. In some embodiments, the electrodes $P_1$ and $P_2$ can be etched simultaneously or separately. In some embodiments, the patterns for $P_1$ and $P_2$ can be shaped as a parallelogram, a rectangle, a diamond, a square, a circle, and the like as necessary without being limited thereto. As illustrated in FIG. 2 and FIG. 3, the number of the first electrodes $P_1$ in the first sensing layer 100 is 8×8. Similarly, the number of the second electrodes $P_2$ in the second sensing layer 200 is respectively 8×8. The number of electrodes in a pattern may change as necessary without being limited thereto, for example, 4×8, 16×16, 16×8, 32×32, and the like.

The first electrodes $P_1$ and the second electrodes $P_2$ are alternately formed or disposed (in turns) at least partially in a first direction and a second direction. The first electrodes $P_1$ and the second electrodes $P_2$ do not overlap each other. Therefore, when the first sensing layer 100 and the second sensing layer 200 are stacked, the first electrodes $P_1$ and the second electrodes $P_2$ form a grid pattern. In the illustration, when the first sensing layer 100 is overlaid with the second sensing layer 200 (or vice-versa), a 16×16 grid of electrodes is defined. Although described as not overlapping, portions of the first electrodes $P_1$ and the second electrodes $P_2$ may overlap to some extent, for example, at corners of the first electrodes P1 connected to other first electrodes P1 and corners of the second electrodes P2 connected to other second electrodes P2.

As illustrated in FIG. 2 and FIG. 3, a first direction Dx may form an X-axis, and a second direction Dy may form a Y-axis.

In some embodiments, electrodes $P_1$ and $P_2$ are formed or disposed in alternating spaces along the X-axis Dx. In some embodiments, the electrodes $P_1$ and $P_2$ are formed or disposed in alternating spaces along the Y-axis Dy.

The first electrodes $P_1$ are electrically connected along the first diagonal direction D1. In other words, the first electrodes $P_1$ are not connected to an adjacent electrode either in the X-axis direction Dx or in the Y-axis direction Dy. However, the first electrodes $P_1$ are connected along the first diagonal direction D1 or along first electrode lines $L_1$. As such, the electrodes along a respective first electrode line $L_1$ receive different voltages and form equal potentials separately.

Similarly, the second electrodes $P_2$ are electrically connected along the second diagonal direction D2. In other words, the second electrodes $P_2$ are not connected to an adjacent electrode either in the X-axis direction Dx or in the Y-axis direction Dy. The second electrodes $P_2$ are connected along the second diagonal direction D2, or along the second electrode lines $L_2$. The second electrode lines $L_2$ receive different voltages and form equal potentials separately.

First diagonal direction D1 and second diagonal direction D2 can be non-orthogonal from X-axis direction Dx and Y-axis direction Dy in a plane, for example, a planar surface on which either the first sensing layer 100 or the second sensing layer 200 is disposed. The first diagonal direction D1 may be not parallel to the X-axis direction Dx and not parallel to the Y-axis direction Dy. The second diagonal direction D2 may be not parallel to the X-axis direction Dx and not parallel to the Y-axis direction Dy. For example, one or both of the first diagonal direction D1 and the second diagonal direction D2 may be oblique with respect to each of the sides of the touch unit 10. Although described as diagonal directions, the first diagonal direction D1 and second diagonal direction D2 need not be exactly diagonal, for example, the first diagonal direction D1 and second diagonal direction D2 can be angled from 5 degrees to about 85 degrees from the X-axis Dx, for example, 20 degrees, 33 degrees, 45 degrees, 60 degrees, and the like. Further, for example, first diagonal direction D1 and second diagonal direction D2 can be angled from 5 degrees to about 85 degrees from the Y-axis Dy, for example, 20 degrees, 33 degrees, 45 degrees, 60 degrees, and the like.

Figure 4:
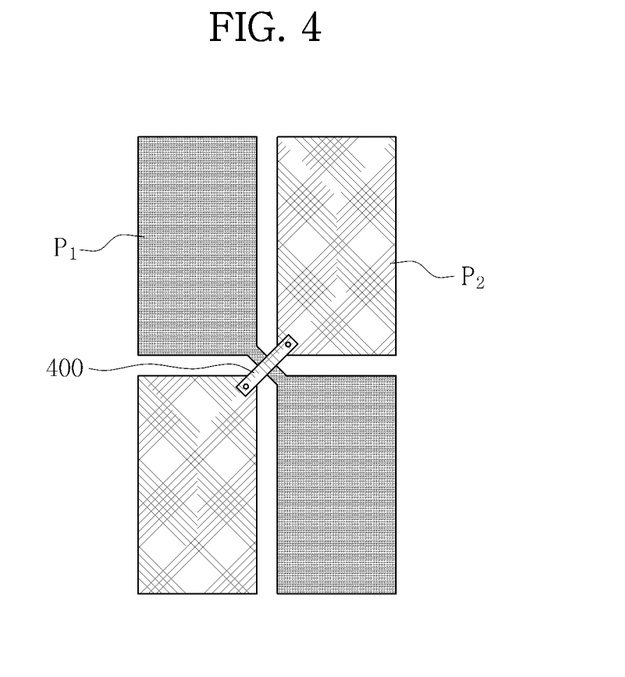
FIG. 4 is an enlarged view illustrating a connection portion of the electrode patterns of FIG. 2.

FIG. 4 is an enlarged view illustrating a connection portion of the electrode patterns of FIG. 2. In some embodiments, any one of the first electrodes P1 and the second electrodes $P_2$ may be connected to a jumper 400 (see FIG. 4) in order to prevent a short at an intersection. In some embodiments, when an insulator is disposed between the first electrodes P1 and the second electrodes $P_2$, jumper 400 is not needed and the electrical connection between diagonal adjacent patterns, for example, in FIG. 4 the second electrodes $P_2$ can be electrically connected with an etching rather than a jumper.

The first electrode lines $L_1$ and the second electrode lines $L_2$ maintain a stable status with constant charges supplied to each line, and if a touch is input, the capacitance changes according to capacitance of a human body or capacitance of a touch pen. Accordingly, a first sensing signal and a second sensing signal representing changed capacitance values are respectively generated from the first electrode lines $L_1$ and the second electrode lines $L_2$. In other words, when a touch is sensed, each of the first electrode lines $L_1$ forms a channel for outputting a first sensing signal, and each of the second electrode lines $L_2$ forms a channel for outputting a second sensing signal.

The first sensing signal generated from the first electrode lines $L_1$ is input to the data processing unit 50 through signal wirings respectively corresponding to the first electrode lines $L_1$. The second sensing signal generated from the second electrode lines $L_2$ is input to the data processing unit 50 through signal wirings respectively corresponding to the second electrode lines $L_2$.

As seen in FIG. 2 and FIG. 3, the signal wirings are formed or disposed in a first connection area $CA_1$ and a second connection area $CA_2$ of the touch unit 10 which face each other. The first connection area $CA_1$ and the second connection area $CA_2$ are a region of the touch unit 10 corresponding to an area other than the display area DA. The first connection area $CA_1$ and the second connection area $CA_2$ correspond to opposite-end regions of the touch unit 10, e.g., regions along opposing edges of a surface of a sensing layer. In some embodiments, the first connection area $CA_1$ and the second connection area $CA_2$ can be disposed along a shorter length of a rectangular shaped sensing layer. As such, the signal wirings at the side area of the touch unit 10 may be omitted, for example, the signal wirings along the longer lengths of a sensing layer or the signal wirings along edges orthogonal to the edges where the connection areas are disposed.

Figure 6:
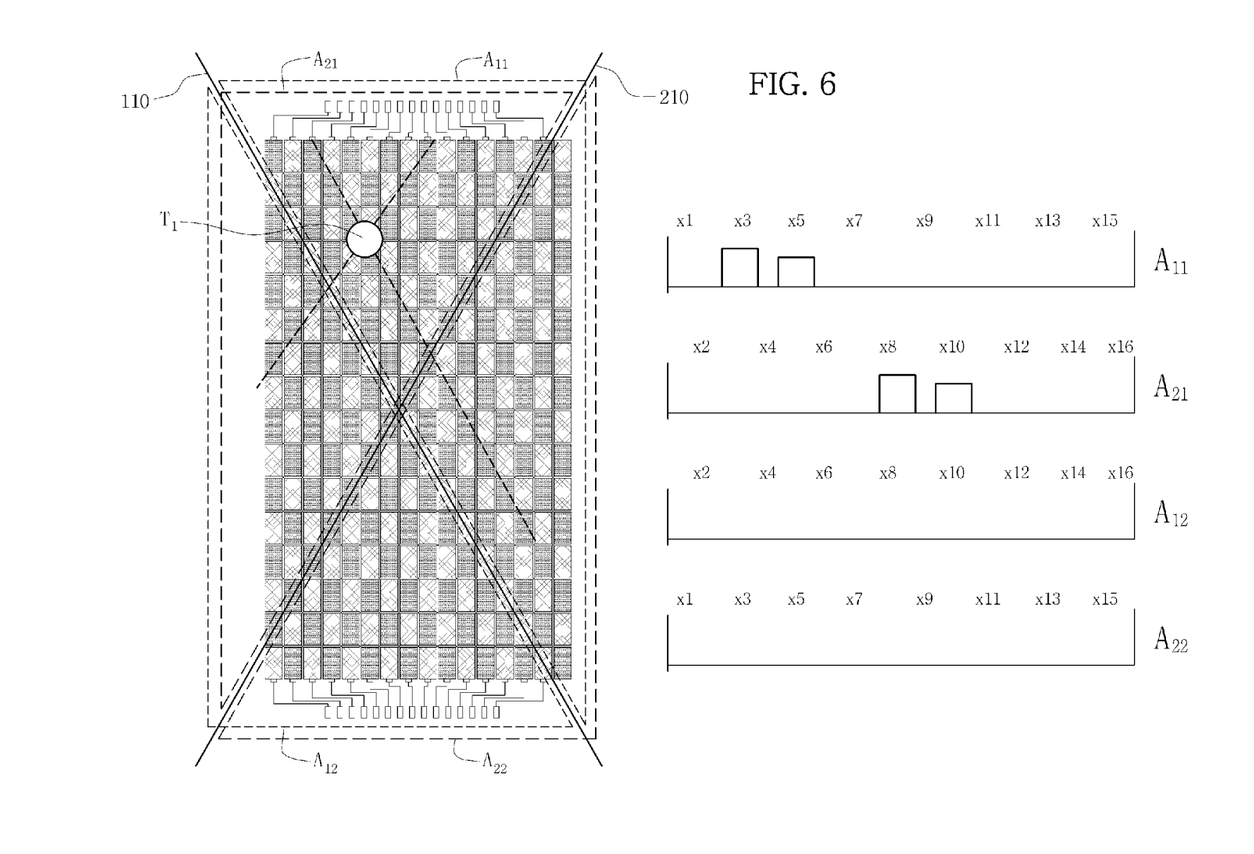
FIG. 6 and FIG. 7 are diagrams illustrating first sensing signals and second sensing signals when a touch is input to the touch unit of FIG. 2.
Figure 7:
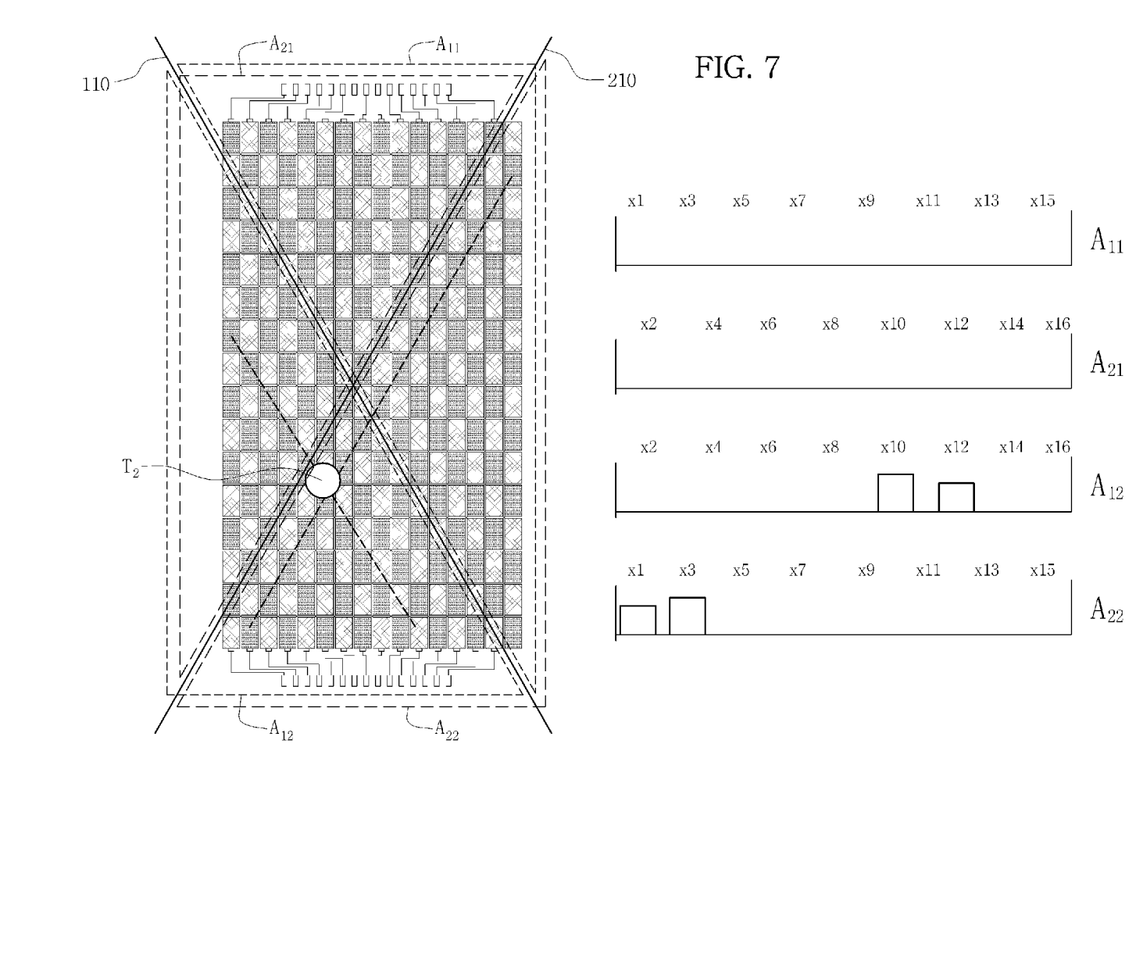

FIG. 6 and FIG. 7 are diagrams illustrating first sensing signals and second sensing signals when a touch is input to the touch unit of FIG. 2.

The first sensing layer 100 is classified into an upper area and a lower area based on the first diagonal 110. As illustrated in FIG. 6, the upper area of the first sensing layer 100 is defined as a first sensing area $A_{11}$, and the lower area of the first sensing layer 100 is defined as a second sensing area $A_{12}$.

Figure 5:
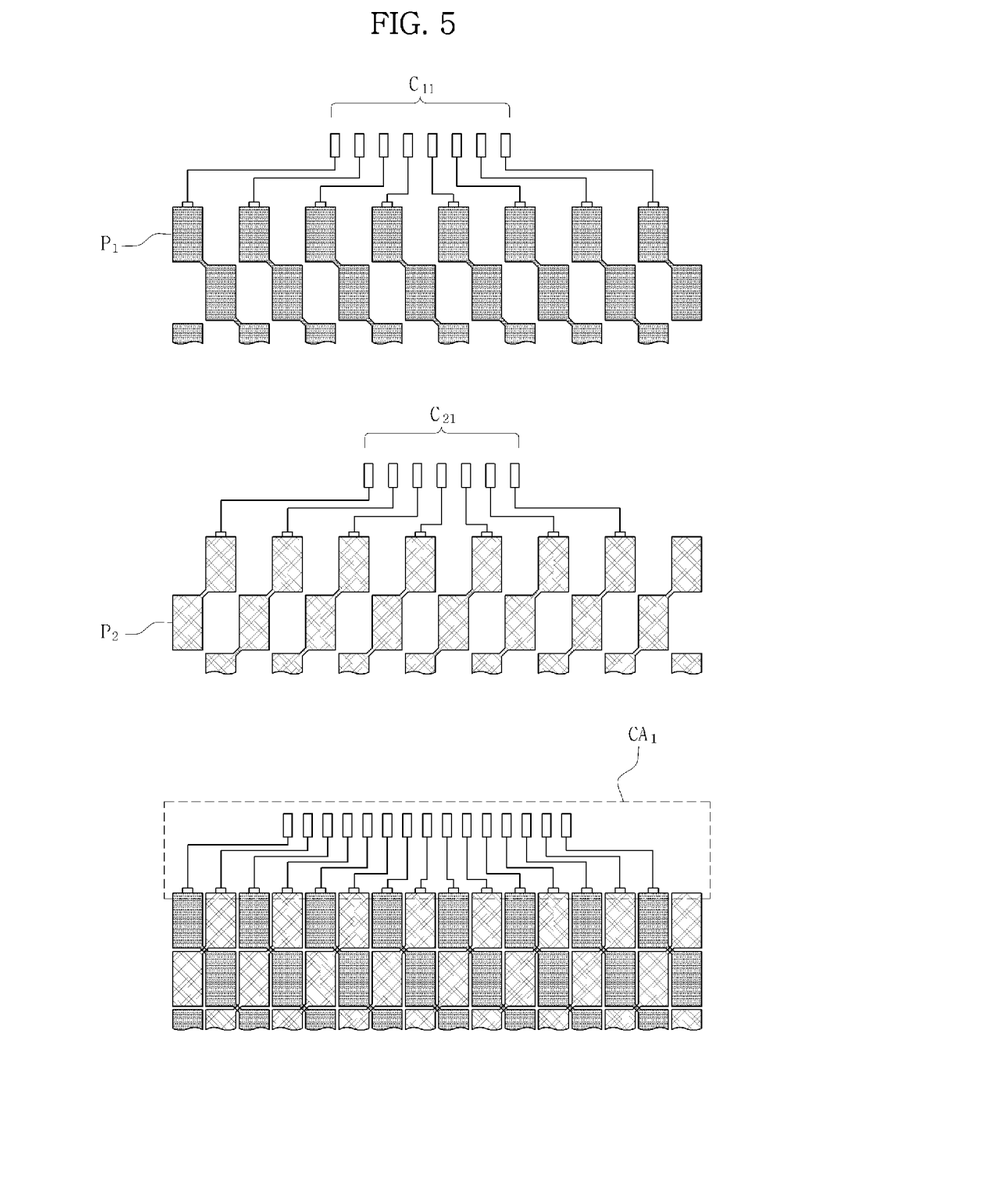
FIG. 5 is an enlarged view illustrating signal wirings connected to the electrode patterns of FIG. 2.

First signal wirings $C_{11}$ in the first connection area $CA_1$ (as shown in FIG. 5) are respectively connected to the first electrode lines $L_1$ formed or disposed in the first sensing area $A_{11}$ of the touch unit 10. Second signal wirings $C_{12}$ in the second connection area $CA_2$ (as shown in FIG. 5) are respectively connected to the first electrode lines $L_1$ formed or disposed in the second sensing area $A_{12}$ of the touch unit 10.

The first electrode line $L_1$ corresponding to the first diagonal 110 may belong to either the first sensing area $A_{11}$ or the second sensing area $A_{12}$, and as such the signal wiring connected to the first electrode line $L_1$ may be formed or disposed in either the first connection area $CA_1$ or the second connection area $CA_2$. Therefore, either the first connection area $CA_1$ or the second connection area $CA_2$ may include a single signal wiring depending on whether the first electrode line $L_1$ corresponding to the first diagonal 110 belongs to the first sensing area $A_{11}$ or the second sensing area $A_{12}$.

The second sensing layer 200 is classified into an upper area and a lower area based on the second diagonal 210 that intersects the first diagonal 110. The upper area of the second sensing layer 200 is defined as a third sensing area $A_{21}$ and the lower area of the second sensing layer 200 is defined as a fourth sensing area $A_{22}$.

Third signal wirings $C_{21}$ in the first connection area $CA_1$ (as shown in FIG. 5) are respectively connected to the second electrode lines $L_2$ formed or disposed in the third sensing area $A_{21}$ of the touch unit 10. Fourth signal wirings $C_{22}$ in the second connection area $CA_2$ (as shown in FIG. 5) are respectively connected to the second electrode lines $L_2$ formed or disposed in the fourth sensing area $A_{22}$ of the touch unit 10.

The second electrode line $L_2$ corresponding to the second diagonal 210 may belong to either the third sensing area $A_{21}$ or the fourth sensing area $A_{22}$, and accordingly the signal wiring connected to the second electrode line $L_2$ may be formed or disposed in either the first connection area $CA_1$ or the second connection area $CA_2$. As such, either the first connection area $CA_1$ or the second connection area $CA_2$ may include a single signal wiring depending on whether the second electrode line $L_2$ corresponding to the second diagonal 210 belongs to the third sensing area $A_{21}$ or the fourth sensing area $A_{22}$.

FIG. 5 is an enlarged view illustrating signal wirings connected to the electrode patterns of FIG. 2. As illustrated in FIG. 5, in the first connection area $CA_1$ of the touch unit 10, the first signal wirings $C_{11}$ connected to the first electrode lines $L_1$ and the third signal wirings $C_{21}$ connected to the second electrode lines $L_2$ can be disposed alternately or in turns. In some embodiments, in a grid pattern formed by the first electrodes $P_1$ and the second electrodes $P_2$, if the odd-numbered electrodes are connected to the first signal wirings $C_{11}$ in the X-axis direction Dx, the even-numbered electrodes can be connected to the third signal wirings $C_{21}$. On the other hand, if odd-numbered electrodes are connected to the third signal wirings $C_{21}$, then the even-numbered electrodes can be connected to the first signal wirings $C_{11}$.

Analogously, in the second connection area $CA_2$ of the touch unit 10, the second signal wirings $C_{12}$ connected to the first electrode lines $L_1$ and the fourth signal wirings $C_{22}$ connected to the second electrode lines $L_2$ can be disposed alternately or in turns.

In this embodiment, the first sensing area $A_{11}$ and the second sensing area $A_{12}$ of the first sensing layer 100 are classified by a diagonal extending from the upper left end to the lower right end thereof, and the third sensing area $A_{21}$ and the fourth sensing area $A_{22}$ of the second sensing layer 200 are classified by a diagonal extending from the upper right end to the lower left end thereof. However, it is also possible that the first sensing area $A_{11}$ and the second sensing area $A_{12}$ of the first sensing layer 100 are classified by a diagonal extending from the upper right end to the lower left end thereof, and the third sensing area $A_{21}$ and the fourth sensing area $A_{22}$ of the second sensing layer 200 are classified by a diagonal extending from the upper left end to the lower right end.

In addition, even though in this exemplary embodiment signal wirings are formed or disposed only in the upper and lower areas of the touch unit 10 and signal wirings at the side surface are omitted, it is also possible that signal wirings are formed or disposed only in both side areas of the touch unit 10 and signal wirings at the upper and lower areas are omitted.

FIGS. 6 and 7 are diagrams illustrating first sensing signals and second sensing signals when a touch is input to the touch unit of FIG. 2.

Referring to FIG. 6, a first touch $T_1$ is input to the first sensing area $A_{11}$ of the first sensing layer 100 and the third sensing area $A_{21}$ of the second sensing layer 200. In the case the first touch $T_1$ is input, the touch may be sensed in a plurality of adjacent electrode lines. In this case, first sensing signals and second sensing signals corresponding to the change of a capacitance value are output from the electrode lines of the first sensing layer 100 and the second sensing layer 200, upon the first touch $T_1$.

In a grid pattern formed by the first electrodes $P_1$ and the second electrodes $P_2$, in the X-axis direction Dx of the uppermost end, the first electrodes $P_1$ form the odd-numbered electrodes, and the second electrodes $P_2$ form the even-numbered electrodes.

For the exemplary touch $T_1$, the first electrode lines $L_1$ formed or disposed in the first sensing area $A_{11}$ of the first sensing layer 100 may output first sensing signals on the first electrode lines $L_1$ extending from a third (×3) first electrode $P_1$ and a fifth (×5) first electrode $P_1$ when the electrodes are counted along the X-axis direction Dx. In addition, among the second electrode lines $L_2$ formed or disposed in the third sensing area $A_{21}$ of the second sensing layer 200, second electrode lines $L_2$ extending from eighth (×8) and tenth (×10) second electrodes $P_2$ in the X-axis direction Dx can output second sensing signals.

Moreover, since a touch is not sensed in the second sensing area $A_{12}$ of the first sensing layer 100 and the fourth sensing area $A_{22}$ of the second sensing layer 200, first electrode lines $L_1$ formed or disposed in the second sensing area $A_{12}$ and second electrode lines $L_2$ formed or disposed in the fourth sensing area $A_{22}$ do not output the sensing signals.

The first sensing signals and the second sensing signals are raw data proportional to the touch area of respective electrode lines, and for example, may be a signal waveform proportional to a touch area of each electrode line as shown in the right region of FIG. 6.

The first sensing signals are transferred to the data processing unit 50 through the first signal wirings $C_{11}$ corresponding to the first electrode lines $L_1$, and the second sensing signals are transferred to the data processing unit 50 through the third signal wirings $C_{21}$ corresponding to the second electrode lines $L_2$.

Referring to FIG. 7, the second touch $T_2$ is input to the second sensing area $A_{12}$ of the first sensing layer 100 and the fourth sensing area $A_{22}$ of the second sensing layer 200. When the second touch $T_2$ is input, the touch may be sensed by a plurality of adjacent electrode lines. In this case, first sensing signals and second sensing signals corresponding to the change of a capacitance value are output from the electrode lines of the first sensing layer 100 and the second sensing layer 200, which were generated by sensing the second touch $T_2$.

In a grid pattern formed by the first electrodes $P_1$ and the second electrodes $P_2$, in the X-axis direction Dx of the lowermost end, the second electrodes $P_2$ may form the odd-numbered patterns, and the first electrodes $P_1$ may form the even-numbered electrodes.

Among the first electrode lines $L_1$ formed or disposed in the second sensing area $A_{12}$ of the first sensing layer 100, first electrode lines $L_1$ extending from tenth (×10) and twelfth (×12) first electrodes $P_1$ in the X-axis direction Dx may respectively output first sensing signals.

Among the second electrode lines $L_2$ formed or disposed in the fourth sensing area $A_{22}$ of the second sensing layer 200, second electrode lines $L_2$ extending from first (×1) and third (×3) second electrodes $P_2$ in the X-axis direction Dx may respectively output second sensing signals.

As a touch is not sensed in the first sensing area $A_{11}$ of the first sensing layer 100 and the third sensing area $A_{21}$ of the second sensing layer 200, first electrode lines $L_1$ formed or disposed in the first sensing area $A_{11}$ and second electrode lines $L_2$ formed or disposed in the third sensing area $A_{21}$ do not output any sensing signals.

The first sensing signals and the second sensing signals are raw data proportional to the touch area of respective electrode lines, and for example, may be a signal waveform proportional to a touch area of each electrode line as shown in the right region of FIG. 7.

The first sensing signals are transferred to the data processing unit 50 through the second signal wirings $C_{12}$ corresponding to the first electrode lines $L_1$, and the second sensing signals are transferred to the data processing unit 50 through the fourth signal wirings $C_{22}$ corresponding to the second electrode lines $L_2$.

The data processing unit 50 analyzes pulse patterns of the first and second sensing signals to confirm that a touch is generated in four electrode lines, and detects a touch area based on the intersecting diagonals. In addition, the data processing unit 50 calculates touch areas of electrode lines corresponding to the change of capacitance from the first and second sensing signals, thereby obtaining X coordinate and Y coordinate of the first touch $T_1$.

The data processing unit 50 normalizes a ratio of contact areas of adjacent electrode lines and stores the normalized ratios in advance, so that a coordinate mapped with the contact area of the calculated touch may be extracted.

FIGS. 6 and 7 show a case where a single touch is input. The same principle may be applied even when multi touches having two or more touches are input.

FIG. 8 is a cross-sectional view illustrating a touch unit. A touch unit 10 can include two layers. The touch unit 10 may include a base film 111, a first film 112, a first ITO layer 113, a first silver layer 114, a first Optical Clear Adhesive (OCA) 115, a second film 116, a second ITO layer 117, a second silver layer 118 and a second OCA 119. The touch unit 10 may have an exemplary height or depth of about 300 µm, about 425 µm, about 550 µm, and the like. Though not shown in the figure, a window glass or a cover glass may be disposed at least at one side, for example, an upper portion, of the touch unit 10.

The base film 111, the first film 112 and the second film 116 may be formed of or with polyethylene terephthalate (PET). The base film 111, the first film 112 and the second film 116 each may have exemplary heights or depths of about 45 µm, about 50 µm, about 75 µm, and the like. The first ITO layer 113 may correspond to the first sensing layer 100 of FIG. 2, and the second ITO layer 117 may be correspond to the second sensing layer 200. In some embodiments, the first ITO layer 113 may correspond to the second sensing layer 200 of FIG. 2, and the second ITO layer 117 may correspond to the first sensing layer 100.

The first silver layer 114 and the second silver layer 118 are signal wirings for outputting sensing signals respectively corresponding to the first sensing layer 100 and the second sensing layer 200. In some embodiments, the first sensing layer 100 and the second sensing layer 200 may be formed or disposed on different films. The first sensing layer 100 and the second sensing layer 200 each may have exemplary heights or depths of about 5 µm, about 10 µm, about 45 µm, about 50 µm, and the like. The first ITO layer 113 and the second ITO layer 117 may be respectively formed or disposed on the first film 112 and the second film 116. In some embodiments, the first sensing layer 100 and the second sensing layer 200 may be formed or disposed on opposing faces of the same film. Each film including the ITO layer may have an exemplary height or depth of about 45 µm, about 50 µm, about 75 µm, and the like.

FIG. 9 is a cross-sectional view illustrating a touch unit 10 including a single layer. The touch unit 10 may include a base film 121, a first ITO layer 122, a first silver layer 123, an OCA 124, a second ITO layer 125, a second silver layer 126, and a window glass or cover glass 127.

The first ITO layer 122 may correspond to the first sensing layer 100 of FIG. 2, and the second ITO layer 125 may correspond to the second sensing layer 200. In some embodiments, the first ITO layer 122 may correspond to the second sensing layer 200 of FIG. 2, and the second ITO layer 125 may correspond to the first sensing layer 100.

The first sensing layer 100 and the second sensing layer 200 may be attached to a single film. The first ITO layer 122 and the second ITO layer 125 may be formed or disposed at the upper and lower portions or on opposing surfaces of the OCA 124, respectively. In some embodiments, the first sensing layer 100 and the second sensing layer 200 may be disposed on the same surface of the base film 121. In some embodiments, the OCA 124 can provide the electric insulator between the first sensing layer 100 and the second sensing layer 200.

FIGS. 8 and 9 are just examples of the cross section of the touch unit 10, and the material and manufacturing process may be selected in various ways as necessary. In addition, heights and depths of various layers illustrated in FIGS. 8 and 9 are exemplary.

The touch unit according to the present disclosure and the terminal including the same provide an electrode pattern signal wirings along two sides of the electrode pattern may be omitted. Therefore, since a bezel width may be reduced by eliminating a dead zone other than the display area, a user may use the terminal more conveniently.

The touch unit according to the present disclosure may be applied to not only personal terminals but also various fields that require a user interface, such as, banks, public offices, expositions, elevators, subways, and theaters.

While the exemplary embodiments have been shown and described, it will be understood by those skilled in the art that various changes in form and details may be made thereto without departing from the spirit and scope of the present disclosure as defined by the appended claims.

What is claimed is:

1. A terminal comprising: a touch unit comprising: first electrodes disposed at least partially in a first diagonal direction, the first diagonal direction being oblique to each side of the touch unit, and second electrodes disposed at least partially in a second diagonal direction that intersects the first diagonal direction, the second diagonal direction being oblique to each side of the touch unit; and a Printed Circuit Board (PCB) configured to receive information generated in response to electric signals from one or more of the first electrodes and the second electrodes, wherein the first electrodes are disposed in a first sensing layer, and the second electrodes are disposed in a second sensing layer wherein the first sensing layer comprises a first connection area to connect signal wirings to one or more of the first electrode lines and a second connection area disposed opposite the first connection area to connect signal wirings to a remainder of the one or more of the first electrode lines.

2. The terminal of claim 1, wherein the first electrodes and the second electrodes are disposed alternately.

3. The terminal of claim 2, wherein the first electrodes and the second electrodes are disposed in a grid pattern along a first direction and a second direction orthogonal to the first direction.

4. The terminal of claim 3, wherein the first diagonal direction intersects the first direction at a non-orthogonal angle.

5. The terminal of claim 1, further comprising:
first electrode lines disposed between the first electrodes, respectively; and
second electrode lines disposed between the first electrodes, respectively.

6. The terminal of claim 5, wherein one or more of the second electrode lines comprises a jumper.

7. The terminal of claim 1, wherein an area of each of the first electrodes does not overlap an area of each of the second electrodes.

8. The terminal of claim 1, further comprising an insulator disposed between the first electrodes and the second electrodes.

9. The terminal of claim 1, wherein the first electrodes comprise transparent Indium Tin Oxide (ITO).

10. The terminal of claim 9, wherein the ITO is disposed by etching.

11. The terminal of claim 1, further comprising a first film to support the first sensing layer thereupon and a second film to support the second sensing layer thereupon.

12. The terminal of claim 11, further comprising a base film, the first film supported by the base film, and the second film supported by the first film.

13. The terminal of claim 1, further comprising a base film, a first sensing layer supported by the base film, and a second sensing layer supported by the first sensing layer,
   wherein the first electrodes are disposed in the first sensing layer, and the second electrodes are disposed in the second sensing layer.

14. The terminal of claim 1, further comprising a base film having a first surface and a second surface opposing the first surface, a first sensing layer supported by the first surface, and a second sensing layer supported by the second surface,
   wherein the first electrodes are disposed in the first sensing layer, and the second electrodes are disposed in the second sensing layer.

15. The terminal of claim 1, further comprising an Optical Clear Adhesive (OCA) or a silver layer supporting one or more of the first sensing layer and the second sensing layer.

16. The terminal of claim 1, further comprising a glass, wherein the glass is disposed above the touch unit.

17. The terminal of claim 1, further comprising a data processing unit configured to receive the electric signals from one or more of the first electrode lines and the second electrode lines, and further configured to provide the information comprising a location of a sensed touch to the processor.

* * * * *